United States Patent

Fujimoto

[11] Patent Number: 5,287,375
[45] Date of Patent: Feb. 15, 1994

[54] APPARATUS FOR DRIVING A LASER DIODE ARRAY
[75] Inventor: Takashi Fujimoto, Tokyo, Japan
[73] Assignee: NEC Corporation, Tokyo, Japan
[21] Appl. No.: 16,937
[22] Filed: Feb. 12, 1993
[30] Foreign Application Priority Data Feb. 12, 1992 [JP] Japan .................................. 4-24939

[51] Int. Cl.⁵ ............................................. H01S 3/096
[52] U.S. Cl. ....................................... 372/38; 372/26; 372/50
[58] Field of Search .............................. 372/38, 26, 50
[56] References Cited
U.S. PATENT DOCUMENTS

| | | | |
|---|---|---|---|
| 4,575,854 | 3/1986 | Martin | 372/75 |
| 4,757,268 | 7/1988 | Abrams et al. | 372/33 |
| 5,099,489 | 3/1992 | Levi et al. | 372/38 |
| 5,170,403 | 12/1992 | Mayer | 372/38 |
| 5,208,817 | 5/1993 | Kao et al. | 372/38 |

Primary Examiner—L on Scott, Jr.
Attorney, Agent, or Firm—Sughrue, Mion, Zinn, Macpeak & Seas

[57] ABSTRACT

An apparatus for driving a laser diode array of the present invention has a reference drive circuit for driving one of laser diodes, a photodiode for detecting an output light of the laser diode, and a control circuit. The reference drive circuit is supplied with input clock signals continuously. The control circuit controls all drive circuits in accordance with an output signal of the photodiode.

4 Claims, 3 Drawing Sheets

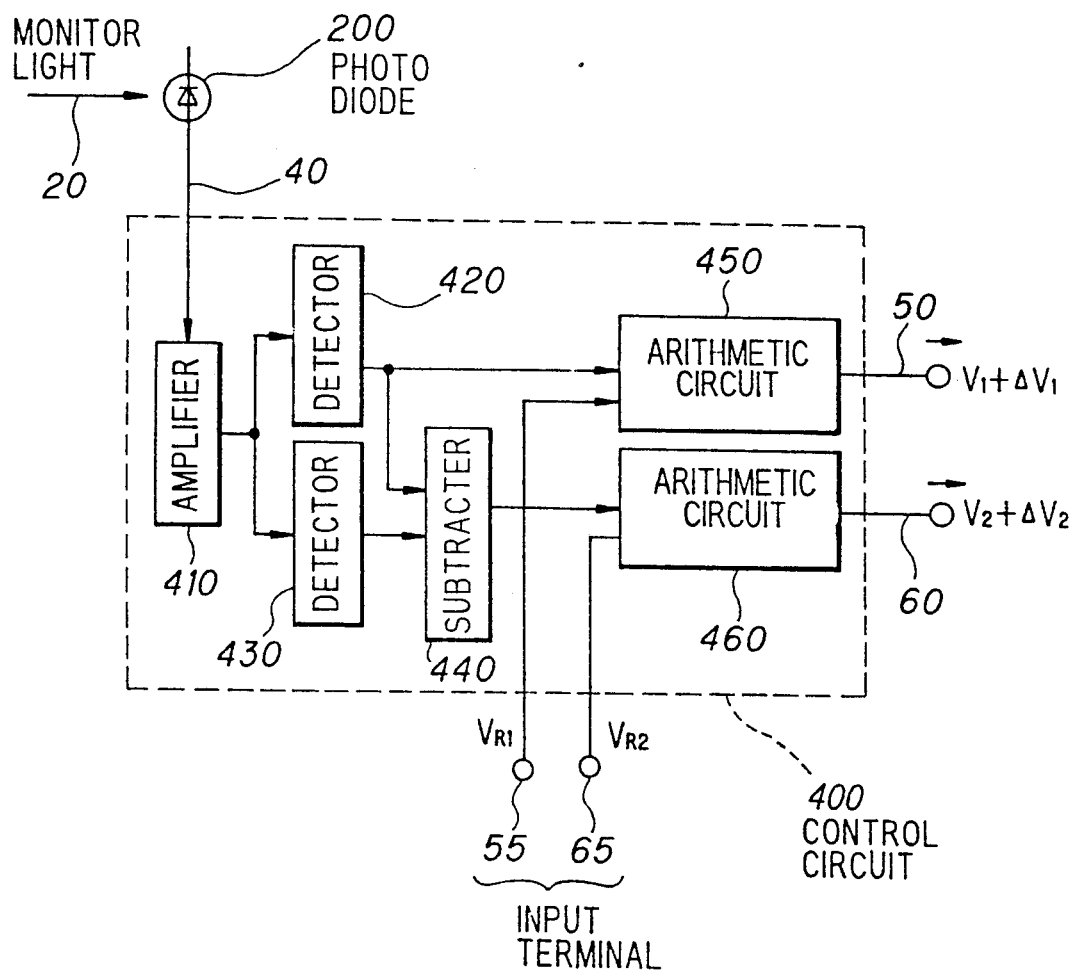

APPARATUS FOR DRIVING A LASER DIODE ARRAY

FIELD OF THE INVENTION

This invention relates to an apparatus for driving a laser diode array, and more particularly, to an apparatus for driving a laser diode array, which is used for an electric to optical converter array in an optical parallel transmission system.

BACKGROUND OF THE INVENTION

A conventional apparatus for driving a laser diode array comprises laser diodes mounted on a common board (non-monolithic type), drive circuits for driving the laser diodes, and a control circuit for controlling the drive circuits by detecting light output of the laser diodes. In one type of the conventional laser diode driving apparatus, scramblers each consisting of an encoder and decoder are provided for each channel to scramble light signals.

In operation, the light outputs are detected to control the drive circuits by the control circuit. In the operation, the scrambler provides a mark ratio of 50% for light signals, so that light output power and threshold values of the laser diodes are compensated.

Such compensation is carried out to cope with the phenomenon in which the light emission of the laser diodes becomes instable due to the non-linearity of the laser diodes, when the laser diodes are turned on after the turning-off state of more than a predetermined time, and vise versa.

In the conventional apparatus for driving a laser diode array, however, there is a disadvantage in that the light outputs of the laser diodes must be detected in the whole channel, because the laser diodes do not have the same property in regard to light output power and threshold value. As a result, the size and the cost of the apparatus are increased.

SUMMARY OF THE INVENTION

Accordingly, it is an object of the invention to provide an apparatus for driving a laser diode array in which a light output of only one laser diode is detected to control whole laser diodes.

It is a further object of the invention to provide an apparatus for driving a laser diode array, the size and the cost of which are decreased.

It is a still further object of the invention to provide an apparatus for driving a laser diode array in which no modulation of light signals is required to eliminate the provision of scramblers each consisting of an encoder and a decoder.

According to the invention, an apparatus for driving a laser diode array includes:

a laser diode array comprising a plurality of laser diode integrated by a monolithic structure;

a laser diode drive circuit array comprising a plurality of laser diode drive circuits integrated by a monolithic structure, each of the laser diode drive circuits comprising a DC bias current drive circuit being supplied with an oscillation threshold value control voltage of a corresponding laser diode of the laser diodes and supplying the corresponding laser diode with a current proportional to the oscillation threshold value control voltage, and a pulse current supply circuit supplying the corresponding laser diode with a signal drive current dependent on an ON and OFF control voltage at a time when an input signal is high and the signal drive current of zero dependent on the ON and OFF control voltage at a time when the input signal is low;

means for supplying a reference signal having a frequency lower than a maximum usable frequency to the pulse current drive circuit in one laser diode drive circuit of the laser diode drive circuits;

means for detecting an output light of one laser diode corresponding to the one laser diode drive circuit; and a control circuit for generating the oscillation threshold value control voltage and the ON and OFF control voltage determining the signal drive current in accordance with a predetermined calculation of maximum and minimum values supplied from the detecting means, the oscillation threshold value being supplied to the DC current supply circuit of all the laser diode drive circuits, and the ON and OFF control voltage being supplied to the pulse current supply circuits of all the laser diode drive circuits.

The other objects and features of the invention will become understood from the following description with reference to the accompanying drawings.

BRIEF DESCRIPTION OF THE DRAWINGS

FIG. 3 is a block diagram showing a control circuit used in the preferred embodiment shown in FIG. 1.

DESCRIPTION OF THE PREFERRED EMBODIMENTS

Figure 1:
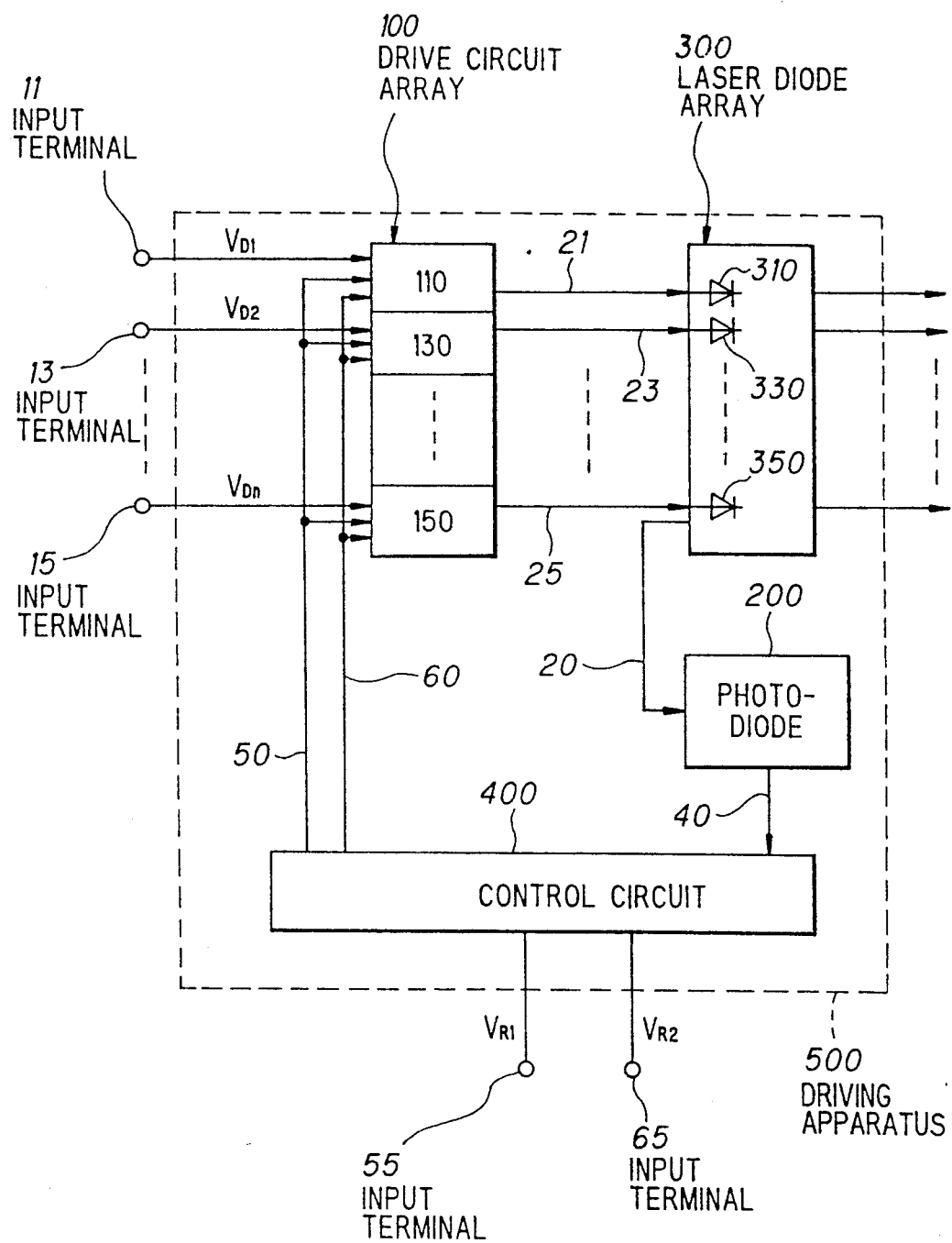
FIG. 1 is a block diagram showing an apparatus for driving a laser diode array of a preferred embodiment according to the invention.

FIG. 1 shows an apparatus for driving a laser diode array of a preferred embodiment according to the invention. The driving apparatus 500 includes data input terminals 11, 13 and 15, a drive circuit array 100 including drive circuits 110, 130 and 150 monolithically integrated to be connected to the data input terminals 11, 13 and 15, a laser diode array 300 including laser diodes 310, 330 and 350 monolithically integrated to be connected through connection lines 21, 23 and 25 to the laser diode drive circuits 110, 130 and 150, respectively, a photodiode 200 optically coupled to the laser diode 350 through a optical fiber 20, a control circuit 400 connected through a connection line 40 to the photodiode 200 and the drive circuits 110, 130 and 150, and input terminals 55 and 65 connected to the control circuit 400.

The data input terminals 11 and 13 are supplied with data signals each having a level of high or low. The data input terminal 15 is continuously supplied with clock pulses or scrambled signals having a constant frequency in the allowed range.

Figure 2:
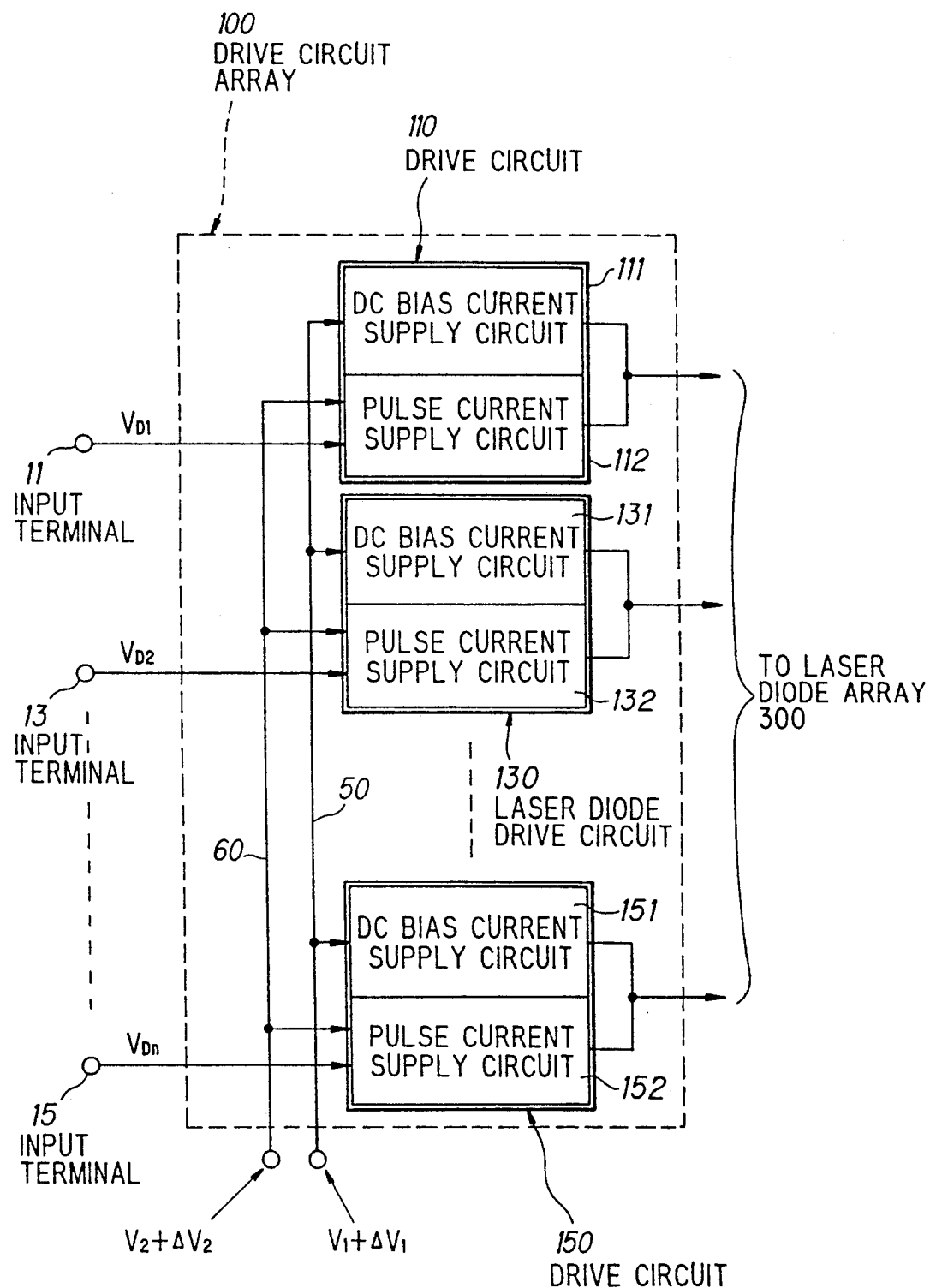
FIG. 2 is a block diagram showing a laser diode drive circuit array used in the preferred embodiment shown in FIG. 1.

FIG. 2 shows the drive circuit array 100 including the drive circuits 110, 130 and 150. The drive circuits 110, 130 and 150 are composed of DC bias current supply circuit 111, 131 and 151 connected through a connection line 50 to the control circuit 400, and pulse current supply circuit 113, 133 and 152 connected to the data input terminals 11, 13 and 15 and to the control circuit 400 through a connection line 60, respectively.

The pulse current supply circuit 113, 133 and 152 are supplied with input data signals $V_{D1}$, $V_{D2}$ and $V_{Dn}$ via the input terminals 11, 13 and 15, respectively.

FIG. 3 shows the control circuit 400, which includes an amplifier 410 connected to the photodiode 200, two detectors 420 and 430 connected to the amplifier 410, a subtracter 440 connected to the detectors 420 and 430, an arithmetic circuit 450 connected at inputs to the detector 420 and the input terminal 55 and at an output to the connection line 50, and an arithmetic circuit 460 connected at inputs to the subtracter 440 and the input terminal 65 and at an output to the connection line 60.

The amplifier 410 converts a current signal from the photodiode 200 to a voltage signal and amplifies the signal. The detectors 420 and 430 detect the maximum voltage $V_3$ and the minimum voltage $V_4$ of the voltage signal supplied from the amplifier 410, respectively. The subtracter 440 calculates the difference voltage $V_5$ of the maximum voltage $V_3$ and the minimum voltage $V_4$.

The arithmetic circuit 450 calculates an oscillation threshold voltage $(V_1 \pm \Delta V_1)$ in accordance with the minimum voltage $V_4$ and a reference voltage $V_{R1}$ supplied to the input terminal 55. That is, the oscillation threshold voltage $(V_1 \pm \Delta V_1)$ is given by $\{V_1 \mp (V_4 - V_{R1})\}$.

The arithmetic circuit 460 calculates a modulation control voltage $(V_2 \pm \Delta V_2)$ in accordance with the difference voltage $V_5$ and a reference voltage $V_{R2}$ supplied to the input terminal 65. That is, the oscillation threshold voltage $(V_2 \pm \Delta V_2)$ is given by $\{V_2 \mp (V_5 - V_{R2})\}$.

In the preferred embodiment, when input data of high level is supplied to the drive circuit 110, a drive signal is generated in accordance with the modulation control voltage signal $(V_2 \pm \Delta V_2)$ and the oscillation threshold voltage signal $(V_1 \pm \Delta V_1)$. The drive signal is supplied from the drive circuit 110 to the laser diode 310. In the same manner, the other laser diodes 330 and 350 are driven.

When an output light is supplied from the laser diode 350 of the laser diode array 300, the output light is detected by the photodiode 200 to provide a monitor current signal. When the monitor current signal is supplied to the amplifier 410 in the control circuit 400, the current signal is converted to a voltage signal and is amplified. Then, the monitored voltage signal is supplied to the detectors 420 and 430, respectively. In the detectors 420 and 430, the maximum voltage $V_3$ and the minimum voltage $V_4$ of the monitored voltage signal are detected.

The minimum voltage signal $V_4$ is latched for a predetermined time to be supplied to the arithmetic circuit 450 and the subtracter 440, respectively. On the other hand, the maximum voltage signal $V_3$ is latched for a predetermined time to be supplied to the subtracter 440. In accordance with the maximum voltage $V_3$ and the minimum voltage $V_4$, a difference voltage $V_5$ thereof is calculated by the subtracter 440, and the difference voltage signal $V_5$ is supplied to the arithmetic circuit 460.

Next, an oscillation threshold voltage $(V_1 \pm \Delta V_1)$ is calculated in accordance with the minimum voltage signal $V_4$ and the reference voltage $V_{R1}$ by the arithmetic circuit 450, and a modulation control voltage $(V_2 \pm \Delta V_2)$ is calculated in accordance with the difference voltage signal $V_5$ and the reference voltage $V_{R2}$ by the arithmetic circuit 460. Then, the oscillation threshold voltage $(V_1 \pm \Delta V_1)$ is supplied to the DC bias current supply circuits 111, 131 and 151, respectively, and the modulation control voltage $(V_2 \pm \Delta V_2)$ is supplied to the pulse current supply circuits 113, 133 and 152, respectively.

The DC bias current supply circuits 111, 131 and 151 supply bias current $(i_1 \pm \alpha \Delta i_1)$ proportional to the oscillation threshold voltage $(V_1 \pm \Delta V_1)$ to the laser diodes 310, 330 and 350, respectively. Therefore, the laser diodes 310, 330 and 350 are supplied with the bias current of a suitable level anytime.

The pulse current supply circuits 113, 133 and 152 supply pulse current $(i_2 \pm \beta \Delta i_2)$ having an amplitude proportional to the modulation control voltage $(V_2 \pm \Delta V_2)$ to the laser diodes 310, 330 and 350, when input data signals of high level are supplied to the pulse current supply circuits. On the other hand, the pulse current supply circuits 113, 133 and 152 supply almost zero current to the laser diodes, when input data signals of low level are supplied thereto. Light power of the laser diodes 310, 330 and 350 may be controlled by adjusting the level of the reference voltage $V_{R2}$. In the same manner, the feedback control operation are repeated.

According to the preferred embodiment, the laser diode 350 is driven continuously, and the drive circuits 110, 130 and 150 are controlled in accordance with the oscillation threshold voltage $(V_1 \pm \Delta V_1)$ and the modulation control voltage $(V_2 \pm \Delta V_2)$, which are generated in accordance with output light of the laser diode 350 having a constant light power. Therefore, output light power of laser diodes 310, 330 and 350 are stable.

As described above, the laser diodes of the laser diode array are integrated by the monolithic structure, and a light output of one laser diode which is controlled to constantly operate by a reference signal is monitored, so that the laser diodes are appropriately controlled at the rising and falling time when the laser diodes are turned on and off after long off and on states to result in instable non-linearity. Consequently, data signals are not necessary to be modulated in a range of DC to a specified maximum frequency.

Further, even if the number of the laser diodes for the laser diode array and that of the drive circuits for the laser diode drive circuit array are increased, only one set of a photodiode and a laser diode control circuit are suffice to control the laser diode array and the laser diode drive circuit array. For this structure, the apparatus becomes small in size and low in cost.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching herein set forth.

What is claimed is:

1. An apparatus for driving a laser diode array operating as an electric to optical converter array in a multichannel parallel communication apparatus, comprising:
   a laser diode array comprising a plurality of laser diode integrated by a monolithic structure;
   a laser diode drive circuit array comprising a plurality of laser diode drive circuits integrated by a monolithic structure, each of said laser diode drive circuits comprising a DC bias current drive circuit being supplied with an oscillation threshold value control voltage of a corresponding laser diode of said laser diodes and supplying said corresponding laser diode with a current proportional to said oscillation threshold value control voltage, and a pulse current supply circuit supplying said corresponding laser diode with a signal drive current dependent on an ON and OFF control voltage at a time when an input signal is high and said signal drive current of zero dependent on said ON and OFF control voltage at a time when said input signal is low;

means for supplying a reference signal having a frequency lower than a maximum usable frequency to said pulse current drive circuit in one laser diode drive circuit of said laser diode drive circuits;

means for detecting an output light of one laser diode corresponding to said one laser diode drive circuit; and a control circuit for generating said oscillation threshold value control voltage and said ON and OFF control voltage determining said signal drive current in accordance with a predetermined calculation of maximum and minimum values supplied from said detecting means, said oscillation threshold value being supplied to said DC current supply circuit of all said laser diode drive circuits, and said ON and OFF control voltage being supplied to said pulse current supply circuits of all said laser diode drive circuits.

2. An apparatus for driving a laser diode array, which includes a plurality of laser diodes integrated by a monolithic structure, comprising:

a drive circuit array comprising a plurality of drive circuits integrated by a monolithic structure for driving said plurality of laser diodes, respectively, wherein one of said plurality of drive circuits is continuously supplied with a reference input signal having a predetermined frequency with level changing high to low periodically;

a photo detector for detecting a strength of an output light supplied from a laser diode driven by said drive circuit which is supplied with said reference input signal; and a control circuit for supplying control signal to all of said drive circuits, respectively, said control signal having a value determined in accordance with an output signal of said photo detector;

wherein said drive circuits supply drive current to said laser diodes, respectively, said drive current having value determined in accordance with said control signal; and said laser diodes supply output lights having strength determined by said drive current.

3. An apparatus for driving a laser diode array, according to claim 2, wherein:

said control circuit supplies a modulation control signal and an oscillation threshold signal as said control signal; and each of said drive circuits comprise first and second circuits for generating bias current and pulse current in accordance with said oscillation threshold signal and said modulation control signal, respectively.

4. An apparatus for driving a laser diode array, according to claim 3, wherein:

said control circuit comprises two detectors for detecting the minimum voltage and the maximum voltage of an output signal of said photo detector, respectively;

a subtracter for generating a difference voltage of said minimum voltage and said maximum voltage;

a first arithmetic circuit for calculating said oscillation threshold signal in accordance with said minimum voltage and a first reference voltage; and a second arithmetic circuit for calculating said modulation control signal in accordance with said difference voltage and a second reference voltage.

* * * * *